United States Patent
Zhou

(10) Patent No.: US 12,015,241 B2
(45) Date of Patent: Jun. 18, 2024

(54) LASER MODULE AND ELECTRONIC DEVICE

(71) Applicant: VIVO MOBILE COMMUNICATION CO., LTD., Guangdong (CN)

(72) Inventor: Feng Zhou, Dongguan (CN)

(73) Assignee: Vivo Mobile Communication Co., Ltd., Dongguan (CN)

( * ) Notice: Subject to any disclaimer, the term of this patent is extended or adjusted under 35 U.S.C. 154(b) by 575 days.

(21) Appl. No.: 17/381,536

(22) Filed: Jul. 21, 2021

(65) Prior Publication Data
US 2021/0351565 A1    Nov. 11, 2021

Related U.S. Application Data

(63) Continuation of application No. PCT/CN2020/071689, filed on Jan. 13, 2020.

(30) Foreign Application Priority Data

Jan. 25, 2019    (CN) .......................... 201910073154.6

(51) Int. Cl.
| | |
|---|---|
| *H01S 5/024* | (2006.01) |
| *H01S 5/0225* | (2021.01) |
| *H01S 5/0235* | (2021.01) |

(52) U.S. Cl.
CPC ........ *H01S 5/02476* (2013.01); *H01S 5/0225* (2021.01); *H01S 5/0235* (2021.01)

(58) Field of Classification Search
CPC .............................. H01S 5/0225; H01S 5/0235
See application file for complete search history.

(56) References Cited

U.S. PATENT DOCUMENTS 4,918,702 A * 4/1990 Kimura .................. B41J 2/471
  372/101
6,867,366 B2    3/2005 Nemoto
(Continued)

FOREIGN PATENT DOCUMENTS

| CN | 1519829 A | 8/2004 |
|---|---|---|
| CN | 101341636 A | 1/2009 |

(Continued)

OTHER PUBLICATIONS

International Search Report and Written Opinion of the International Searching Authority regarding International Application No. PCT/CN2020/071689, dated Mar. 30, 2020. Translation provided by Bohui Intellectual Property.
(Continued)

*Primary Examiner* — Tuan N Nguyen
(74) *Attorney, Agent, or Firm* — Harness, Dickey & Pierce, P.L.C.

(57) ABSTRACT

A laser module includes an optical assembly, a laser chip disposed on a side of the optical assembly, a power supply structure, a packaging structure and a heat dissipation structure. The power supply structure includes a first electrode and a second electrode both connected to the laser chip. An accommodating cavity is formed in the packaging structure, and the optical assembly is at least partially received in the accommodating cavity. The heat dissipation structure is sleeved on an outer side of the packaging structure, and abuts against the first electrode and the second electrode.

14 Claims, 3 Drawing Sheets

(56) References Cited

U.S. PATENT DOCUMENTS

| | | |
|---|---|---|
| 10,495,271 B2 | 12/2019 | Sato |
| 2007/0159773 A1 | 7/2007 | Deng et al. |
| 2012/0085525 A1 | 4/2012 | Redpath |
| 2014/0307755 A1 | 10/2014 | Wojcik et al. |
| 2014/0328361 A1 | 11/2014 | Matsusue |
| 2015/0109680 A1 | 4/2015 | Vorndran et al. |
| 2017/0063032 A1 | 3/2017 | Morizumi et al. |
| 2017/0093123 A1 | 3/2017 | Takizawa et al. |
| 2017/0222403 A1* | 8/2017 | Vorndran ........... G02B 19/0052 |
| 2019/0148909 A1 | 5/2019 | Kuroda et al. |

FOREIGN PATENT DOCUMENTS

| | | |
|---|---|---|
| CN | 103891065 A | 6/2014 |
| CN | 106486886 A | 3/2017 |
| CN | 109586165 A | 4/2019 |
| EP | 1282206 A1 | 2/2003 |
| JP | S55132088 A | 10/1980 |
| JP | H0448671 A | 2/1992 |
| JP | H0448672 A | 2/1992 |
| JP | 2560135 B2 | 12/1996 |
| JP | 2012256953 A | 12/2012 |
| JP | 2014160555 A | 9/2014 |
| JP | 201745936 U | 3/2017 |
| KR | 10-2009-0017246 A | 2/2009 |
| WO | WO-2011063224 A2 | 5/2011 |

OTHER PUBLICATIONS

First Office Action regarding Chinese Patent Application No. 201910073154.6, dated Sep. 16, 2019. Translation provided by Bohui Intellectual Property.

Supplementary European Search Report regarding Patent Application No. 20745019.8-1211/3916934; PCT/CN2020/071689, dated Feb. 23, 2022.

First Office Action regarding Indian Patent Application No. 202117037752, dated Apr. 11, 2022.

First Office Action regarding Japanese Patent Application No. 2021-543259, dated Jul. 25, 2022. Translation provided by Bohui Intellectual Property.

First Office Action regarding Korean Patent Application No. 10-2021-7026756, dated Aug. 29, 2022. Translation provided by Bohui Intellectual Property.

* cited by examiner

LASER MODULE AND ELECTRONIC DEVICE

CROSS-REFERENCE TO RELATED APPLICATIONS

This application is a Bypass Continuation Application of PCT/CN2020/071689 filed on Jan. 13, 2020, which claims priority to Chinese Patent Application No. 201910073154.6 filed on Jan. 25, 2019, which are incorporated herein by reference in their entirety.

TECHNICAL FIELD

This disclosure relates to the field of laser device technologies, and in particular, to a laser module and an electronic device.

BACKGROUND

A 3D recognition technology is widely used in fields such as face recognition for unlocking and payment. A laser module is an indispensable core component for 3D recognition, and is mainly used to emit ultra-short femtosecond pulses or project specific light patterns, so that a system obtains depth information. As one of the most important components in the laser module, a laser chip plays a key role during working of the laser module.

SUMMARY

According to a first aspect, an embodiment of this disclosure provides a laser module, including:
  an optical assembly;
  a laser chip, disposed on a side of the optical assembly;
  a power supply structure, including a first electrode and a second electrode, where the first electrode and the second electrode are both connected to the laser chip;
  a packaging structure in which an accommodating cavity is formed, where the optical assembly is at least partially received in the accommodating cavity; and
  a heat dissipation structure, sleeved on an outer side of the packaging structure, where the heat dissipation structure abuts against the first electrode and the second electrode.

According to a second aspect, an embodiment of this disclosure further provides an electronic device, where the electronic device includes the laser module according to the first aspect.

BRIEF DESCRIPTION OF DRAWINGS

To describe the technical solutions in the embodiments of this disclosure more clearly, the following briefly introduces the accompanying drawings required for describing the embodiments of this disclosure. Apparently, the accompanying drawings in the following description show merely some embodiments of this disclosure, and a person of ordinary skill in the art may still derive other drawings from these accompanying drawings.

DESCRIPTION OF EMBODIMENTS

The following clearly describes the technical solutions in the embodiments of this disclosure with reference to the accompanying drawings in the embodiments of this disclosure. Apparently, the described embodiments are some but not all of the embodiments of this disclosure. All other embodiments obtained by a person of ordinary skill in the art based on the embodiments of this disclosure shall fall within the protection scope of this disclosure.

The term "and/or" in this specification describes only an association relationship for describing associated objects and represents that three relationships may exist. For example, A and/or B may represent the following three cases: only A exists, both A and B exist, and only B exists.

The laser chip is a semiconductor device sensitive to temperature. A higher temperature indicates a lower photoelectric conversion efficiency of the laser chip. The high temperature may easily damage a lattice structure of the laser chip to reduce a service life of the laser chip. However, laser chips in laser modules mostly dissipate heat through circuit boards connected to the laser chips, resulting in low heat dissipation efficiency of the laser chips.

Figure 1:
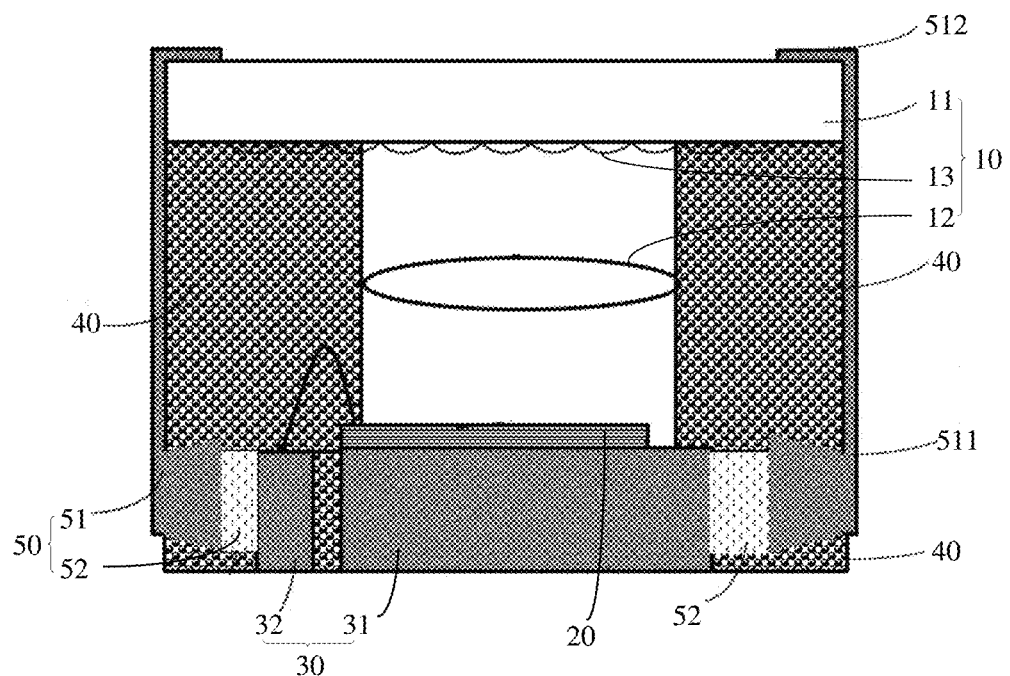
FIG. 1 is a sectional view of a laser module according to an embodiment of this disclosure.
Figure 2:
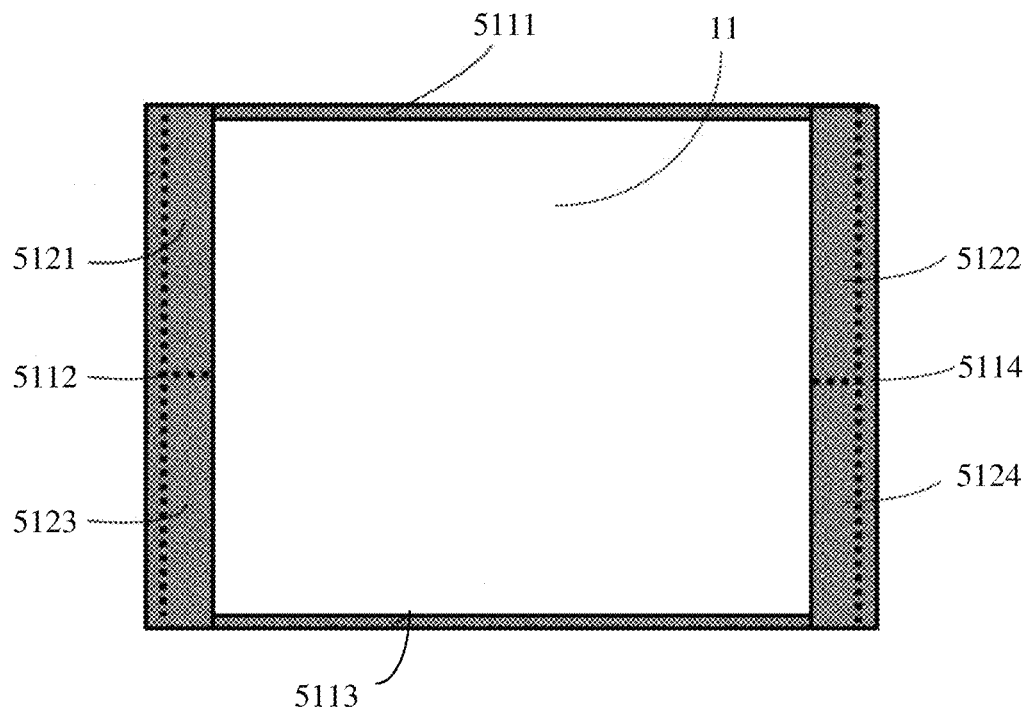
FIG. 2 is a top view of the laser module in FIG. 1.
Figure 3:
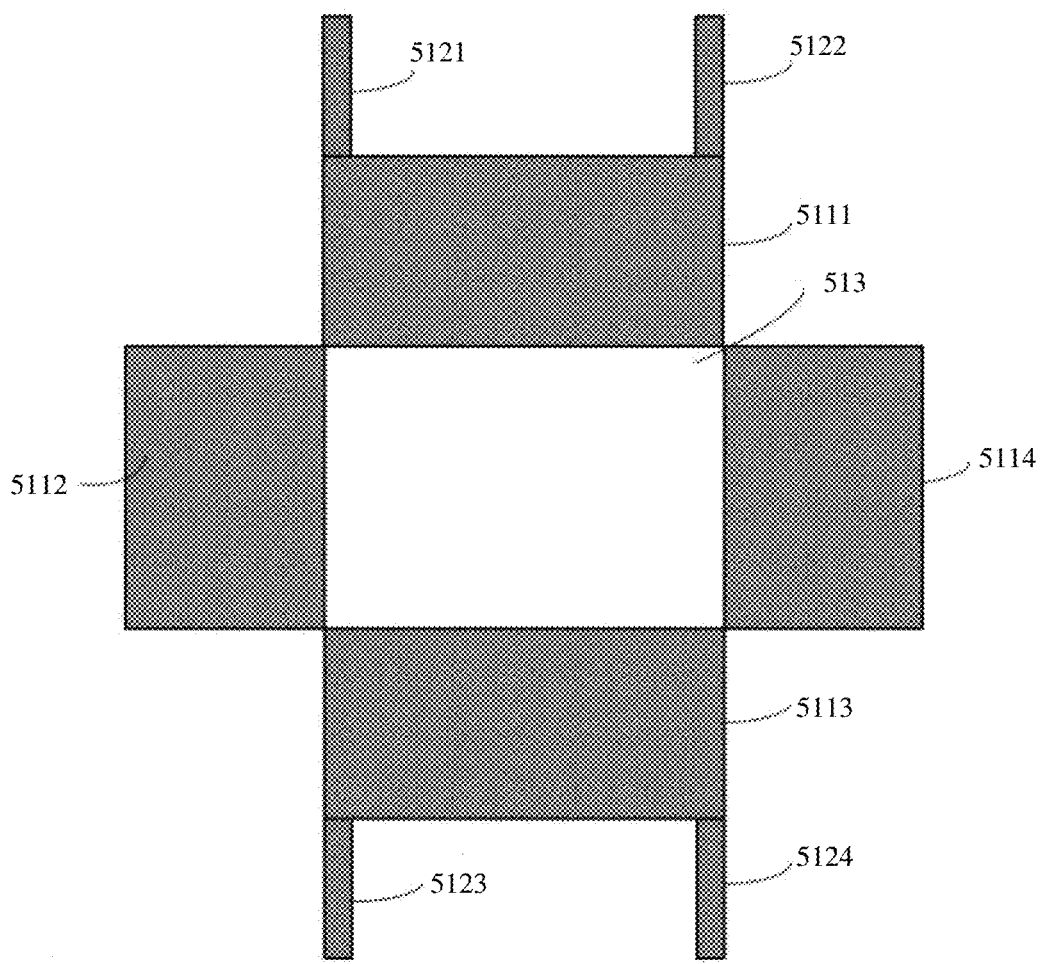
FIG. 3 is a structural diagram of a heat dissipation body in the laser module provided in FIG. 1.
Figure 4:
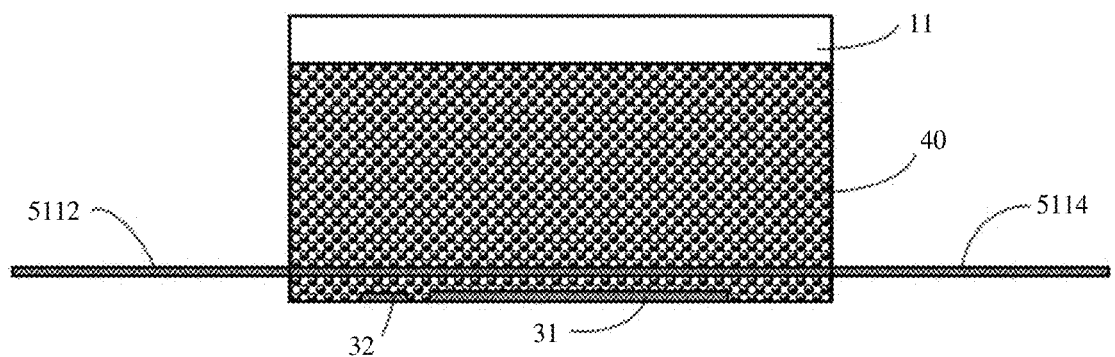
FIG. 4 is a structural diagram of a heat dissipation body that has not been installed in the laser module provided in FIG. 1.
Figure 5:
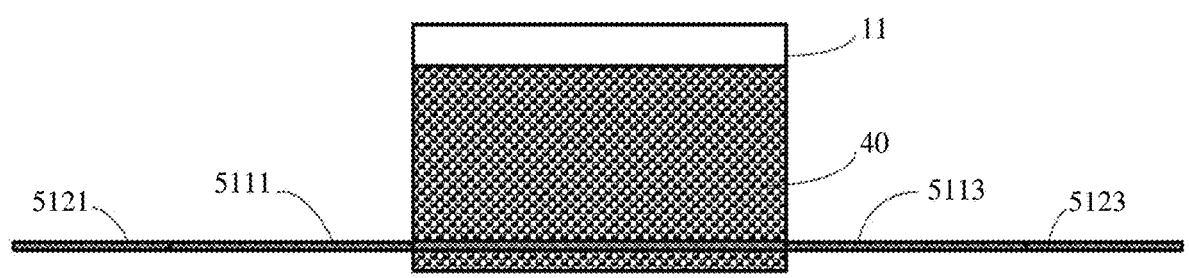
FIG. 5 is a left side view of FIG. 4.

Referring to FIG. 1 to FIG. 5, FIG. 1 is a sectional view of a laser module according to an embodiment of this disclosure; FIG. 2 is a top view of the laser module in FIG. 1; FIG. 3 is a structural diagram of a heat dissipation body in the laser module provided in FIG. 1; FIG. 4 is a structural diagram of a heat dissipation body that has not been installed in the laser module provided in FIG. 1; and FIG. 5 is a left side view of FIG. 4.

Referring to FIG. 1, an embodiment of this disclosure provides a laser module, including an optical assembly 10, a laser chip 20, a power supply structure 30, a packaging structure 40, and a heat dissipation structure 50. The laser chip 20 is disposed on a side of the optical assembly 10, and the power supply structure 30 includes a first electrode 31 and a second electrode 32. The first electrode 31 and the second electrode 32 are both connected to the laser chip 20 for supplying power to the laser chip 20. An accommodating cavity is formed in the packaging structure 40 and the optical assembly 10 is at least partially received in the accommodating cavity. The heat dissipation structure 50 is sleeved on the outer side of the packaging structure 40, and the heat dissipation structure 50 abuts against the first electrode 31 and the second electrode 32.

According to the technical solutions provided in the embodiments of this disclosure, the heat dissipation structure 50 abuts against the first electrode 31 and the second electrode 32, and therefore the first electrode 31 and the second electrode 32 can conduct heat generated by the laser chip 20, the first electrode 31, and the second electrode 32 to the heat dissipation structure 50. Furthermore, the heat dissipation structure 50 sleeved on the outer side of the packaging structure 40 makes the heat dissipation structure 50 have a larger heat dissipation area for heat dissipation, thereby improving heat dissipation efficiency of the laser module to ensure working performance and a service life of the laser chip 20.

In addition, the heat dissipation structure 50 sleeved on the outer side of the packaging structure 40 can function to fasten and support the packaging structure 40. For example, in a case that the packaging structure 40 is a columnar structure, the heat dissipation structure 50 may be a tubular structure that sleeves an outer surface of the packaging structure 40 to surround the packaging structure 40, thereby fastening the packaging structure 40.

The heat dissipation structure 50 may be a material with relatively optimal thermal conductivity but no electrical conductivity, so as to ensure the heat dissipation performance of the heat dissipation structure 50 and further prevent the power supply structure 30 from leaking electricity through the heat dissipation structure 50, thereby ensuring use safety of the laser module.

Optionally, the power supply structure 30 may be disposed on a side of the laser chip 20 away from the optical assembly 10. For example, the power supply structure 30 may be a circuit board, and the laser chip 20 may be attached to the circuit board, so that the laser chip 20 and the power supply structure 30 have a larger contact area, to improve heat transfer efficiency between the power supply structure 30 and the laser chip 20 and further help improve heat dissipation efficiency of the laser chip 20.

The laser chip 20 and the power supply structure 30 may be located outside the packaging structure 40. Alternatively, as shown in FIG. 1, the laser chip 20 and the power supply structure 30 may be located inside the packaging structure 40, so that the laser chip 20 and the power supply structure 30 can be fastened by the packaging structure 40, further ensuring overall stability of the laser module.

In an optional implementation, the heat dissipation structure 50 includes a heat dissipation body 51 and a heat conductor 52, and the heat dissipation body 51 is sleeved on the outer side of the packaging structure 40. One side of the heat conductor 52 abuts against the heat dissipation body 51, and another side of the heat conductor 52 abuts against the first electrode 31 and the second electrode 32. In other words, the heat conductor 52 is disposed between the power supply structure 30 and the heat dissipation body 51. For example, the heat conductor 52 may have a ring structure, with an inner wall of the heat conductor 52 abutting against the first electrode 31 and the second electrode 32, and an outer wall of the heat conductor 52 abutting against the heat dissipation body 51. In this case, the first electrode 31 and the second electrode 32 each have a larger contact area with the heat conductor 52, so that the heat conductor 52 can absorb more quickly the heat that is conducted to the first electrode 31 and the second electrode 32 from the first electrode 31, the second electrode 32, and the laser chip 20, thereby improving the heat dissipation efficiency of the laser module.

The heat conductor 52 is made of an electrically non-conductive material, and the heat dissipation body 51 is made of a metal material. The heat conductor 52 made of the electrically non-conductive material does not have electrical conductivity, so as to further prevent the power supply structure 30 from leaking electricity through the heat conductor 52, thereby ensuring use safety of the laser module.

The heat dissipation body 51 made of the metal material has better thermal conductivity, and the heat dissipation body 51 made of the metal material has a better electromagnetic shielding effect. For example, the material of the heat dissipation body 51 may be copper, and copper has a relatively high thermal conductivity coefficient and features good stability and low costs, thereby reducing manufacturing costs of the laser module.

In addition, the heat dissipation body 51 is sleeved on the outer side of the packaging structure 40, and as shown in FIG. 1, the laser chip 20 is received in the accommodating cavity of the packaging structure 40. Therefore, the heat dissipation body 51 made of the metal material can reduce electromagnetic interference of the laser module to other components of the electronic device.

Optionally, the heat dissipation body 51 includes a substrate 511 and an extension piece 512. The substrate 511 is sleeved on the outer side of the packaging structure 40, and the substrate 511 includes a first end and a second end opposite to each other, where the first end abuts against the heat conductor 52, and the second end is connected to the extension piece 512. The extension piece 512 is located on a side of the optical assembly 10 away from the laser chip 20.

For example, when the packaging structure 40 is a hollow columnar structure, and the substrate 511 may be a tubular structure that is sleeved on the outer surface of the packaging structure 40. The substrate 511 of the tubular structure includes the first end and the second end opposite to and facing away from each other. The first end abuts against the heat conductor 52 to absorb the heat of the heat conductor 52. The second end is close to the optical assembly 10, and the extension piece 512 is disposed on the second end. The extension piece 512 is located on the side of the optical assembly 10 away from the laser chip 20, to fasten the optical assembly 10, thereby ensuring installation stability of the optical assembly 10.

Referring to FIG. 3 to FIG. 5, in a implementation, the substrate 511 includes a first side plate 5111, a second side plate 5112, a third side plate 5113, and a fourth side plate 5114 that are sequentially connected. A first through hole 513 is surrounded by the first side plate 5111, the second side plate 5112, the third side plate 5113, and the fourth side plate 5114. The packaging structure 40 is located in the first through hole 513, and the extension piece 512 is disposed on the first side plate 5111 and/or the third side plate 5113. The through hole is square, and the packaging structure 40 is also a square structure. The first side plate 5111, the second side plate 5112, the third side plate 5113, and the fourth side plate 5114 are sequentially connected to form the square-shaped substrate 511, and the substrate 511 may be an outer surface that covers the packaging structure 40, so that the substrate 511 has a larger surface area to increase the heat dissipation area of the heat dissipation body 51, thereby improving the heat dissipation efficiency of the laser module and better supporting and fastening the packaging structure 40.

The extension piece 512 may be disposed on the first side plate 5111 or the third side plate 5113, or the extension piece 512 is disposed on the first side plate 5111 and the third side plate 5113 each. For example, the extension piece 512 is disposed on the first side plate 5111, with the extension piece 512 connected to the third side plate 5113, so that the extension piece 512 is attached to the optical assembly 10, to press the optical assembly 10, thereby fastening the optical assembly 10.

Alternatively, the extension piece 512 is disposed on the first side plate 5111, the second side plate 5112, the third side plate 5113, and the fourth side plate 5114 each, and the extension pieces 512 are attached to the side of the optical assembly 10 away from the laser chip 20. In other words, the extension piece 512 can function to fasten the optical assembly 10.

Referring to FIG. 2 and FIG. 3, a first extension piece 5121 and a second extension piece 5122 are disposed on the first side plate 5111, and a third extension piece 5123 and a fourth extension piece 5124 are disposed on the third side plate 5113. The first extension piece 5121 is connected to the third extension piece 5123 and the second side plate 5112.

The third extension piece 5123 is connected to the second side plate 5112, the second extension piece 5122 is connected to the fourth extension piece 5124 and the fourth side plate 5114, and the fourth extension piece 5124 is connected to the fourth side plate 5114.

In this embodiment, the first side plate 5111, the second side plate 5112, the third side plate 5113, and the fourth side plate 5114 are welded to form a hollow quadrangular prism structure, and the packaging structure 40 and part of the optical assembly 10 are all received in the quadrangular prism structure. The first extension piece 5121 and the third extension piece 5123 are both welded to the top end of the second side plate 5112, and the second extension piece 5122 and the fourth extension piece 5124 are both welded to the top end of the fourth side plate 5114. A top view of the laser module is shown in FIG. 2. In this way, the first extension piece 5121, the third extension piece 5123, the second extension piece 5122, and the fourth extension piece 5124 also press on the top of the optical assembly 10, to further fasten the optical assembly 10, preventing the optical assembly 10 from falling off and ensuring stability of the laser module. In addition, with such disposition, additional fixing parts are not required to fasten the optical assembly 10, thereby reducing hardware costs of the laser module.

Referring to FIG. 1 again, a second through hole is formed in the heat conductor 52, the first electrode 31 and the second electrode 32 are located in the second through hole, and the first electrode 31 and the second electrode 32 both abut against the inner wall of the heat conductor 52. The first electrode 31 may be a positive electrode, and the second electrode 32 may be a negative electrode, so as to supply power to the laser chip 20. The first electrode 31 and the second electrode 32 may have a plate-like structure, and the first electrode 31 and the second electrode 32 may be packaged in the packaging structure 40.

Optionally, the laser chip 20 is attached to the first electrode 31, so that the laser chip 20 and the first electrode 31 have a larger contact area. In this way, the heat generated by the laser chip 20 can be conducted faster to the first electrode 31, and then conducted to the heat conductor 52 through the first electrode 31.

Optionally, the optical assembly 10 includes an optical element 11 and a collimating element 12. The collimating element 12 is disposed on a side of the laser chip 20, and the collimating element 12 is received in the accommodating cavity. The optical element 11 is disposed on a side of the collimating element 12 away from the laser chip 20, and the extension piece 512 abuts against a side of the optical element 11 away from the collimating element 12. It can be understood that the laser light emitted by the laser chip 20 passes through the collimating element 12 and is then projected to the optical element 11 in the form of parallel light. The optical element 11 is used to project the parallel light in the form of scattered light, so that the laser light emitted by the laser chip 20 can have a larger coverage.

In addition, a light divergence element 13 is disposed on a side of the optical element facing the collimating element. The light divergence element 13 is used to diverge the laser light emitted by the laser chip 20, so that the laser light emitted by the light divergence element 13 has a larger emission angle. Optionally, the light divergent element 13 may be a micro galvanometer.

In this embodiment, a process flow for components of the laser module may be as follows: first attach the laser chip 20 to the first electrode 31, and connect the laser chip 20 and the second electrode 32 through a wire; dispose the heat conductor 52 on the outer side of the first electrode 31 and on the outer side of the second electrode 32; package the first electrode 31, the second electrode 32, the heat conductor 52, and the laser chip 20 by using a packaging material to form the packaging structure 40; mount the collimating element 12 on the side of the laser chip 20 away from the first electrode 31; mount the optical element 11 on the side of the collimating element 12 away from the laser chip 20; bend the substrate 511 and the extension piece 512, attach the substrate 511 to the outer wall of the packaging structure 40, and attach the extension piece 512 to the optical element 11; and then weld the substrate 511 and the extension piece 512. The laser module provided in this embodiment of this disclosure has a simpler process flow and lower costs.

According to the technical solution provided in this embodiment of this disclosure, the heat generated by the laser chip 20 can be conducted to the heat conductor 52 through the power supply structure 30, and then conducted to the heat dissipation body 51 through the heat conductor 52. The heat dissipation body 51 sleeved on the outer side of the packaging structure 40 has a larger overall area, and therefore has a larger heat dissipation area for heat dissipation, improving the heat dissipation efficiency of the laser module and ensuring the working performance and service life of the laser chip 20. Furthermore, the higher heat dissipation efficiency is also good for development of high-power laser modules to apply 3D recognition to long-distance photographing.

An embodiment of this disclosure further provides an electronic device. The electronic device includes the laser module in the embodiment described in FIG. 1 to FIG. 5, and has all technical features of the laser module in the foregoing embodiment, with the same technical effects achieved. Details are not be repeated herein.

The electronic device may include at least one of a mobile phone, a tablet computer, an e-book reader, an MP3 player, an MP4 player, a digital camera, a laptop computer, an in-vehicle computer, a desktop computer, a set-top box, a smart TV, a wearable device, and a smart home appliance.

The foregoing descriptions are merely specific implementations of this disclosure, but are not intended to limit the protection scope of this disclosure. Any variation or replacement readily figured out by a person skilled in the art within the technical scope disclosed in this disclosure shall fall within the protection scope of this disclosure. Therefore, the protection scope of this disclosure shall be subject to the protection scope of the claims.

What is claimed is:

1. A laser module, comprising:
   an optical assembly;
   a laser chip, disposed on a side of the optical assembly;
   a power supply structure, comprising a first electrode and a second electrode, wherein the first electrode and the second electrode are both connected to the laser chip;
   a packaging structure in which an accommodating cavity is formed, wherein the optical assembly is at least partially received in the accommodating cavity; and
   a heat dissipation structure, sleeved on an outer side of the packaging structure, wherein the heat dissipation structure abuts against the first electrode and the second electrode;
   the heat dissipation structure comprises a heat dissipation body and a heat conductor, wherein the heat dissipation body is sleeved on the outer side of the packaging structure, one side of the heat conductor abuts against the heat dissipation body, and another side of the heat conductor abuts against the first electrode and the second electrode; and the heat dissipation body comprises a substrate and an extension piece, wherein the substrate is sleeved on the outer side of the packaging structure, the substrate comprises a first end and a second end opposite to and facing away from each other, the first end abuts against the heat conductor, the second end is connected to the extension piece, and the extension piece is located on a side of the optical assembly away from the laser chip.

2. The laser module according to claim 1, wherein the substrate comprises a first side plate, a second side plate, a third side plate, and a fourth side plate that are sequentially connected; a first through hole is surrounded by the first side plate, the second side plate, the third side plate, and the fourth side plate; the packaging structure is located in the first through hole; and the extension piece is disposed on the first side plate and/or the third side plate.

3. The laser module according to claim 2, wherein a first extension piece and a second extension piece are disposed on the first side plate; a third extension piece and a fourth extension piece are disposed on the third side plate; the first extension piece is connected to the third extension piece and the second side plate; the third extension piece is connected to the second side plate; the second extension piece is connected to the fourth extension piece and the fourth side plate; and the fourth extension piece is connected to the fourth side plate.

4. The laser module according to claim 2, wherein a second through hole is formed in the heat conductor; the first electrode and the second electrode are located in the second through hole; and the first electrode and the second electrode both abut against an inner wall of the heat conductor.

5. The laser module according to claim 1, wherein the optical assembly comprises an optical element and a collimating element; the collimating element is disposed on a side of the laser chip, and the collimating element is received in the accommodating cavity; the optical element is disposed on a side of the collimating element away from the laser chip; and the extension piece abuts against a side of the optical element away from the collimating element.

6. The laser module according to claim 5, wherein a light divergence element is disposed on a side of the optical element facing the collimating element.

7. The laser module according to claim 1, wherein the heat conductor is made of an electrically non-conductive material, and the heat dissipation body is made of a metal material.

8. An electronic device, comprising a laser module, wherein the laser module comprises:
an optical assembly;
a laser chip, disposed on a side of the optical assembly;
a power supply structure, comprising a first electrode and a second electrode, wherein the first electrode and the second electrode are both connected to the laser chip;
a packaging structure in which an accommodating cavity is formed, wherein the optical assembly is at least partially received in the accommodating cavity; and
a heat dissipation structure, sleeved on an outer side of the packaging structure, wherein the heat dissipation structure abuts against the first electrode and the second electrode;
the heat dissipation structure comprises a heat dissipation body and a heat conductor, wherein the heat dissipation body is sleeved on the outer side of the packaging structure, one side of the heat conductor abuts against the heat dissipation body, and another side of the heat conductor abuts against the first electrode and the second electrode; and
the heat dissipation body comprises a substrate and an extension piece, wherein the substrate is sleeved on the outer side of the packaging structure, the substrate comprises a first end and a second end opposite to and facing away from each other, the first end abuts against the heat conductor, the second end is connected to the extension piece, and the extension piece is located on a side of the optical assembly away from the laser chip.

9. The electronic device according to claim 8, wherein the substrate comprises a first side plate, a second side plate, a third side plate, and a fourth side plate that are sequentially connected; a first through hole is surrounded by the first side plate, the second side plate, the third side plate, and the fourth side plate; the packaging structure is located in the first through hole; and the extension piece is disposed on the first side plate and/or the third side plate.

10. The electronic device according to claim 9, wherein a first extension piece and a second extension piece are disposed on the first side plate; a third extension piece and a fourth extension piece are disposed on the third side plate; the first extension piece is connected to the third extension piece and the second side plate; the third extension piece is connected to the second side plate; the second extension piece is connected to the fourth extension piece and the fourth side plate; and the fourth extension piece is connected to the fourth side plate.

11. The electronic device according to claim 9, wherein a second through hole is formed in the heat conductor; the first electrode and the second electrode are located in the second through hole; and the first electrode and the second electrode both abut against an inner wall of the heat conductor.

12. The electronic device according to claim 8, wherein the optical assembly comprises an optical element and a collimating element; the collimating element is disposed on a side of the laser chip, and the collimating element is received in the accommodating cavity; the optical element is disposed on a side of the collimating element away from the laser chip; and the extension piece abuts against a side of the optical element away from the collimating element.

13. The electronic device according to claim 12, wherein a light divergence element is disposed on a side of the optical element facing the collimating element.

14. The electronic device according to claim 8, wherein the heat conductor is made of an electrically non-conductive material, and the heat dissipation body is made of a metal material.

* * * * *